(12) United States Patent
Aaltonen et al.

(10) Patent No.: US 9,696,375 B2
(45) Date of Patent: Jul. 4, 2017

(54) CAPACITIVE MICROELECTROMECHANICAL SENSOR WITH SELF-TEST CAPABILITY

(71) Applicant: MURATA MANUFACTURING CO., LTD., Nagaokakyo-shi, Kyoto (JP)

(72) Inventors: Lasse Aaltonen, Espoo (FI); Jouni Erkkilä, Helsinki (FI)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/877,257

(22) Filed: Oct. 7, 2015

(65) Prior Publication Data

US 2016/0103174 A1    Apr. 14, 2016

(30) Foreign Application Priority Data

Oct. 13, 2014  (FI) ...................................... 20145894

(51) Int. Cl.
  *G01R 31/3187*  (2006.01)
  *G01R 31/28*  (2006.01)
  *G01P 15/125*  (2006.01)
  *G01P 21/00*  (2006.01)

(52) U.S. Cl.
  CPC ........ *G01R 31/2884* (2013.01); *G01P 15/125* (2013.01); *G01P 21/00* (2013.01)

(58) Field of Classification Search
  CPC .... G01R 17/06; G01R 19/0084; G01D 3/036; G01L 9/12; H02M 3/07
  USPC ................. 324/71.1, 76.11, 76.66, 76.79, 96
  See application file for complete search history.

(56) References Cited

U.S. PATENT DOCUMENTS

| 5,751,154 A | * | 5/1998 | Tsugai | G01D 5/2417 |
| | | | | 324/661 |
| 6,169,428 B1 | * | 1/2001 | Mader | G01R 19/0084 |
| | | | | 327/101 |
| 6,178,818 B1 | * | 1/2001 | Plochinger | G01D 5/2405 |
| | | | | 361/284 |
| 2002/0011108 A1 | | 1/2002 | Aoyama et al. | |
| 2004/0215260 A1 | * | 10/2004 | Vonk | A61N 1/362 |
| | | | | 607/11 |

(Continued)

FOREIGN PATENT DOCUMENTS

CN   101281220 A   10/2008
CN   203535119 U    4/2014

(Continued)

OTHER PUBLICATIONS

Finnish Search Report dated Jun. 12, 2015 corresponding to Finnish Patent Application No. 20145894.

(Continued)

*Primary Examiner* — Giovanni Astacio-Oquendo
(74) *Attorney, Agent, or Firm* — Squire Patton Boggs (US) LLP

(57) ABSTRACT

A capacitive sensor that includes at least one capacitive element and a switched-capacitor readout circuit part for detecting at least one signal capacitance that results from motions of the capacitive element. The self-test bias voltage of the actuation circuit part is coupled to the capacitive element during a first period that is synchronized to the front end reset period and occurs when the self-test of the capacitive sensor is enabled by the self-test controller.

20 Claims, 10 Drawing Sheets

(56) References Cited

U.S. PATENT DOCUMENTS

| | | | |
|---|---|---|---|
| 2008/0079444 A1* | 4/2008 | Denison | G01D 5/24 |
| | | | 324/679 |
| 2008/0197861 A1 | 8/2008 | Grosjean | |
| 2013/0001550 A1 | 1/2013 | Seeger et al. | |
| 2014/0152332 A1* | 6/2014 | Platte | G01N 27/07 |
| | | | 324/713 |
| 2016/0156319 A1* | 6/2016 | Barbieri | H04R 3/00 |
| | | | 381/111 |

FOREIGN PATENT DOCUMENTS

| | | |
|---|---|---|
| EP | 2648003 A1 | 10/2013 |
| TW | 200914843 A | 4/2009 |

OTHER PUBLICATIONS

A. Mason et al., "A mixed-voltage sensor readout circuit with on-chip calibration and built-in self-test," IEEE Sensors Journal, vol. 7, No. 9, Sep. 2007, pp. 1225-1232.
International Search Report application No. PCT/IB2015/057720 mailed Jan. 4, 2016.
Taiwanese Search Report dated Dec. 15, 2016, issued in corresponding TW Application No. 104133332.

* cited by examiner

CAPACITIVE MICROELECTROMECHANICAL SENSOR WITH SELF-TEST CAPABILITY

BACKGROUND

Field

The present invention relates to microelectromechanical devices and specifically to an inertial sensor with self-test capability and a self-test method for an inertial sensor.

Description of the Related Art

Capacitive microelectromechanical sensors have become part of many consumer devices and they are used also in a variety of safety critical applications. Especially in the latter case, it is important to identify potential failures in mechanical or electrical signal paths of the capacitive sensor.

In capacitive sensors, acceleration-like self-test signals can be generated using electrostatic forces. However, in order to mimic the full-scale acceleration induced motion of the micromechanical proof mass, voltages higher than nominal supply voltage are typically needed.

High voltages should preferably be generated locally because external high-voltage sources are often not available, especially in field conditions. On-chip generation of variable high-voltages is, however, often area consuming because high-ohmic resistive feedback is needed in order to scale down and control the magnitude of the generated high-voltage. Additionally, any discrete time circuitry or logic in high-voltage domain easily draws additional current. In some cases, high-voltage switches and logic increase complexity of the device because of limited gate-source voltage tolerance in switch transistors. Furthermore, use of resistors consumes not only circuit/chip area, but also power, because the pump needs to supply the current that flows through the resistive dividers. Large capacitors for enabling large current consumption from a charge pump circuitry consume significant circuit/chip area, and should be avoided.

SUMMARY

An object of the present invention is to provide for a capacitive sensor local self-test capability that avoids or at least alleviates at least one of the above challenges. This objective of the present invention is achieved with a capacitive sensor and a self-test method described herein.

Embodiments of the present invention define a capacitive sensor that includes at least one capacitive element and a switched-capacitor readout circuit part for detecting at least one signal capacitance that results from motions of the capacitive element. A first switch arrangement is configured to electrically couple the switched-capacitor readout circuit part to the capacitive element for a front end readout period, and to electrically decouple the switched-capacitor readout circuit part from the capacitive element for a front end reset period. The capacitive sensor also includes a self-test controller configured to enable and disable a self-test of the capacitive sensor, and an actuation circuit part for generating a self-test bias voltage for electrostatic deflection of the capacitive element. A second switch arrangement is configured to electrically couple the self-test bias voltage of the actuation circuit part to the capacitive element during a first period. The first period is synchronized to the front end reset period and is configured to occur when the self-test of the capacitive sensor is enabled by the self-test controller, and to electrically decouple the actuation circuit part from the capacitive element in times other than the first period.

The actuation circuit part includes a high-voltage charge pump and a high-voltage charge pump control circuitry enabling and disabling generation of the self-test bias voltage by the high-voltage charge pump. The second switch arrangement is configured to generate a self-test control signal, a first state of the self-test control signal relating to the first period, and the second state of the self-test control signal relating to the times other than the first period. The high-voltage charge pump control circuitry is responsive to the self-test control signal such that enabling and disabling generation of the self-test bias voltage by the high-voltage charge pump depends on the self-test control signal.

Embodiments also define a self-test method for a capacitive sensor that includes at least one capacitive element, a switched-capacitor readout circuit part for detecting at least one signal capacitance that results from motions of the capacitive element, and a first switch arrangement configured to electrically couple the switched-capacitor readout circuit part to the capacitive element for a front end readout period, and to electrically decouple the switched-capacitor readout circuit part from the capacitive element for a front end reset period. The method comprises generating in the capacitive sensor a self-test bias voltage for electrostatic deflection of the capacitive element during first periods, wherein the first periods are synchronized to the front end reset periods and are configured to occur when the self-test of the capacitive sensor is enabled. The self-test bias voltage is decoupled from the capacitive element in times other than the first period.

The method further defines generating a self-test control signal, wherein a first state of the self-test control signal relates to the first period, and the second state of the self-test control signal relates to the times other than the first period; and enabling and disabling generation of the self-test bias voltage by the high-voltage charge pump in response to the self-test control signal.

Features and advantages of the claimed invention and its embodiments are described in more detail with the detailed description of the embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various generic features of capacitive transducer structures or microelectromechanical devices that are generally known to a person skilled in the art may not be specifically described herein.

Figure 1:
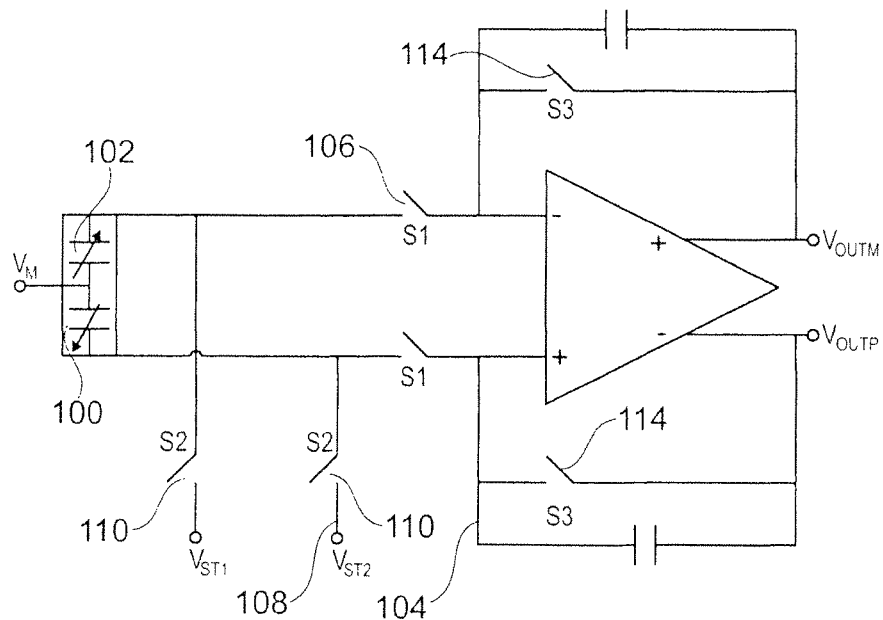
FIG. 1 shows a simplified diagram of a sensor structure.

FIG. 1 shows a simplified diagram illustrating basic elements necessary to describe embodiments of the present invention. The capacitive sensor comprises at least one microelectromechanical element that includes at least one capacitive element. The capacitive element includes a proof mass (rotor) and a stator which remains stationary relative to the proof mass as it moves in response to acceleration. The position of the proof mass in a reference system is measured by detecting signal capacitance. An electrode attached to or incorporated by the proof mass and an electrode attached to or incorporated by the stator form a capacitance. When the proof mass moves relative to the stator, a change in the distance between the electrodes is converted to a change in the capacitance.

A single variable capacitor is created between a static electrode of the stator and a moving electrode of the proof mass. The total capacitance of the single variable capacitor includes a static capacitance defined by the capacitor configuration and a signal capacitance that results from the motion of the proof mass in response to external acceleration. FIG. 1 illustrates an exemplary embodiment of acceleration capacitive sensor with two variable capacitors 100, 102. The capacitors 100, 102 form a capacitive half-bridge where sensitivity of the first variable capacitor 100 to the proof mass position is opposite to the sensitivity of the second variable capacitor 102 so that the total capacitances of the capacitors change with opposite signs. The capacitance on one side of the capacitive half-bridge increases with acceleration, while the other side proportionally decreases. Also capacitor structures with more than one or two variable capacitors may be applied within the scope.

Figure 2:
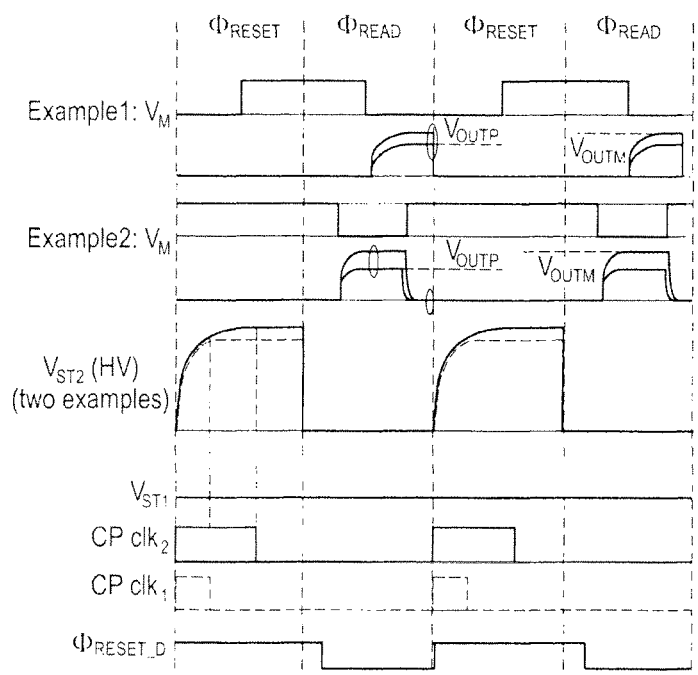
FIG. 2 illustrates operation of the readout circuit part 104 of FIG. 1.

The capacitive sensor includes also a switched-capacitor readout circuit part 104 for detecting signal capacitances that result from motions of the capacitive elements 100, 102. FIG. 2 illustrates operation of the readout circuit part 104 of FIG. 1. A voltage $V_M$ across a capacitive element 100, 102 is modulated in charge up and charge down steps that form two non-overlapping phases. In the first one of them, a capacitive element 100, 102 is connected to a voltage $V_M$ and accumulates charge. In the second phase, the capacitive element 100, 102 is pulled to ground and the capacitive element 100, 102 is discharged. The switched-capacitor readout circuit part 104 may include a high-gain operational amplifier with a high open-loop gain, and the two capacitive elements 100, 102 may be connected to its inputs. Accordingly, during a front end readout period $\phi_{read}$, when the voltage $V_M$ to a first capacitive element 100 changes to zero, the output voltage $V_{OUTP}$ changes from zero to a value that corresponds to accumulated charge of the first capacitive element 100. Similarly, when the voltage $V_M$ to a second capacitive element 102 changes to zero, the output voltage $V_{OUTN}$ changes from zero to a value that corresponds to accumulated charge of the second capacitive element 102. The difference between $V_{OUTP}$ and $V_{OUTN}$ depends on the position of the proof mass at the time of voltage $V_M$ zero edge. It is understood that FIG. 2 is a simplified example with only basic parts necessary for describing the invention. For example, the operational amplifier of the switched-capacitor readout circuit part 104 may have input-common-mode circuitry or it may comprise two single-ended operational amplifiers to keep both the differential and common-mode input of the operational amplifier at a fixed voltage.

FIG. 2 illustrates two example setups with different voltage $V_M$ profiles.

In Example 1 of FIG. 2, the period of voltage $V_M$ is shown to be equal to the front end readout period $\phi_{read}$, with an edge in the middle of the front end readout period, and the output voltages $V_{OUTP}$ and $V_{OUTN}$ are zeroed by end of the front end readout period $\phi_{read}$. It is, however, understood that the timing of switching during the readout phase may be arranged in many ways.

In capacitive detection, it is necessary to establish a zero point measurement, i.e. the switched capacitance circuit 104 needs to be reset between sampling periods. The capacitive sensor thus comprises a first switch arrangement S1 106 configured to electrically couple the readout circuit part 104 to the capacitive element for a front end readout period $\phi_{read}$, and to electrically decouple the readout circuit part 104 from the one or more capacitive elements 100, 102 for resetting the readout circuit part 104 for a front end reset period $\phi_{reset}$. This is illustrated in FIG. 2 where a time period of exemplary signals has been time-divisioned into alternating readout periods $\phi_{read}$, and reset periods $\phi_{reset}$.

In the present invention, this time-discrete nature of switched-capacitor detection is applied to implement an advanced high-voltage generating system to facilitate in-field self-test capability of the sensor device. For this, the capacitive sensor includes an actuation circuit part 108 for generating a bias voltage for electrostatic deflection of the one or more capacitive elements 100, 102. For self-test, the actuation circuit part 108 may be electrically coupled to the one or more capacitive elements 100, 102 during the front end reset periods $\phi_{reset}$, and decoupled from them during the front end readout periods $\phi_{read}$ by means of a second switch arrangement S2 110. The second switch arrangement 110 is directly synchronized to the first switch arrangement S1 106.

The direct synchronization means that the second switch arrangement S2 110 is configured to electrically couple the actuation circuit part 108 to the capacitive element for a first period, wherein the first period is synchronized to the front end reset period and is configured to occur when the self-test of the capacitive sensor is enabled by the self-test controller. The second switch arrangement S2 110 is also configured to electrically decouple the actuation circuit part from the capacitive element in times other than the first period, i.e. when the self-test is not run and when the self-test is run, but a front end readout period is on. When the actuation circuit part is coupled to the capacitive element, the generated bias voltage creates an electrostatic force and causes a deflection to the capacitive element. The caused deflection may be detected during the readout period of the self-test and applied to determine whether the capacitive element operates normally or not.

Figure 3:
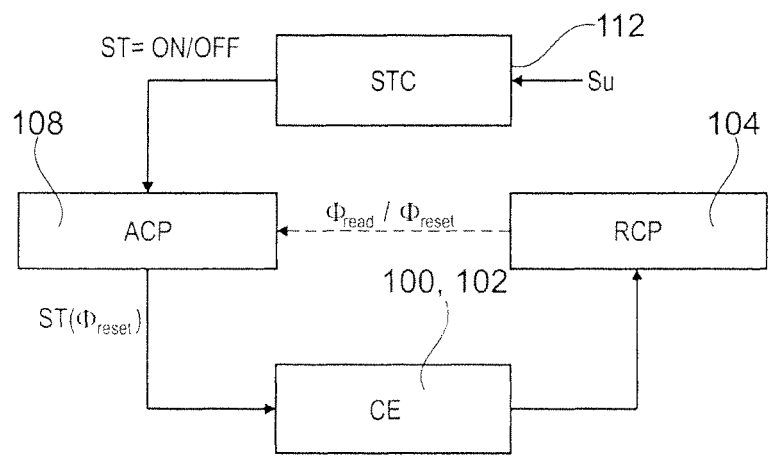
FIG. 3 illustrates the concept of direct synchronization in the sensor structure.

The direct synchronization is illustrated with a block chart in FIG. 3. As described above, the capacitive sensor includes one or more capacitive elements 100, 102, a readout circuit part 104, and an actuation circuit part 108. In addition, the capacitive sensor may include a self-test controller 112 that inputs a user controlled signal Su. The self-test controller 112 is configured to enable or disable a self-test of the capacitive sensor in response to the user-controlled signal Su. The dashed line between the readout circuit part 104 and the actuation circuit part 108 illustrates the direct synchronization between switching functions of the two circuit parts 104, 108. The second switch arrangement 110 may control coupling of the actuation circuit part to the one or more capacitive elements 100, 102 by means of a self-test control signal $ST(\phi_{reset})$ that is dependent on both the user-controlled self-test status of the capacitive sensor and readout/reset status of the switched-capacitor readout part. For example, when a self-test is enabled (ST=ON) and the first switch arrangement 106 has a front end reset period $\phi_{reset}$, the resulting self-test control signal $ST(\phi_{reset})$ may lead to a coupling between the actuation circuit part and the one or more capacitive elements. The controlling mechanisms will be described in more detail with FIG. 6.

Returning to FIG. 1, the capacitive sensor may further comprise a third switch arrangement S3 114, synchronized to the first switch arrangement 108 and configured to reset the readout circuit part 104 in the beginning of the readout periods. This allows the inputs and outputs of the operational amplifier to settle before occurrence of a read pulse ($V_M$ transient). This eliminates or at least significantly reduces effects of self-test bias related transients from detection.

Example 2 of FIG. 2 illustrates an alternative $V_M$ voltage scheme, showing the charge transfer stages at the time of voltage $V_M$ rise edge. This scheme allows two samples to be extracted during a single $\phi_{read}$ read phase. A subsequent processing circuitry following the readout circuit part 104 may be arranged to reset between the falling and rising edges of $V_M$ to ensure that a detected output corresponds to a change caused by a single $V_M$ transient only. In this scheme, $V_M$ transients occur during readout periods and $V_M$ is constant during reset periods. This means that self-test biasing schemes can be designed without taking into account $V_M$ transients. An additional benefit of the alternative scheme is that two samples with inverse polarity will allow chopping, when the output sample is formed as a difference between two consecutive samples in a single $\phi_{read}$ read phase.

Figure 4:
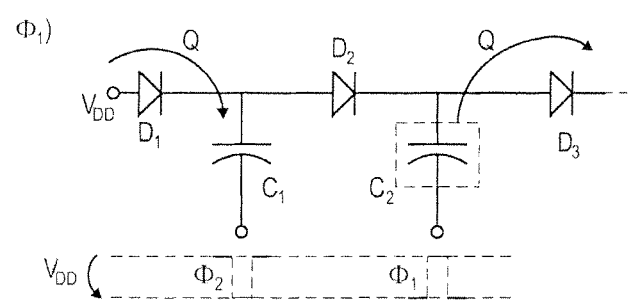
FIG. 4 illustrates operation of a charge pump.
Figure 4:
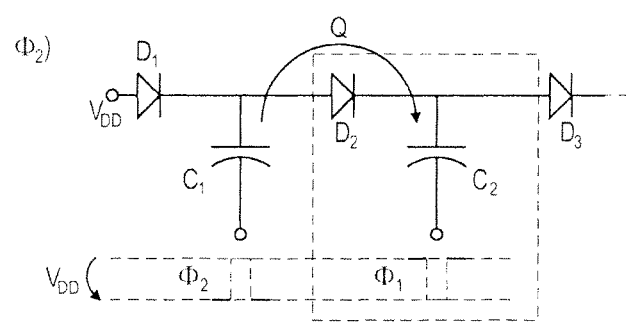

In order to create a necessary high-voltage for the self-test, the actuation circuit part 108 may include a charge pump. Charge pumps provide a way to increase voltages above the nominal supply of a circuit. The key component in charge-pump circuits is a non-linear charge transfer element that allows an alternating current input voltage to be rectified and increased. FIG. 4 illustrates operation of a charge pump by means of first stages of a Dickson charge pump with ideal diodes. During start-up of the exemplary charge pump, a first capacitor C1 is charged in phase $\phi_1$ to $V_{DD}$ through a forward biased first diode D1. At the same time, the voltage at the cathode of a second diode D2 increases above $V_{DD}$, creating a reverse bias across the diode. Some charge from a second capacitor C2 is moved through a third diode to the next pump stage. When phase $\phi_2$ becomes active, the voltage at a bottom plate of the first capacitor C1 is increased by $V_{DD}$ while the voltage at the cathode of the first diode D1 attempts to rise to $2V_{DD}$. However, if the voltage of the second capacitor C2 is lower than $2V_{DD}$, the second diode D2 becomes forward biased and balances the voltages of the first capacitor C1 and the second capacitor C2. In a steady state, with zero load current and parasitic capacitances, no charge transfer occurs, while the voltage across the first capacitor C1 and the second capacitor C2 are $V_{DD}$ and $2V_{DD}$, respectively. It is understood that the charge pump of FIG. 4 is exemplary only. Other charge pump configurations, well known to a person skilled in the art, may be applied within the scope.

Figure 5:
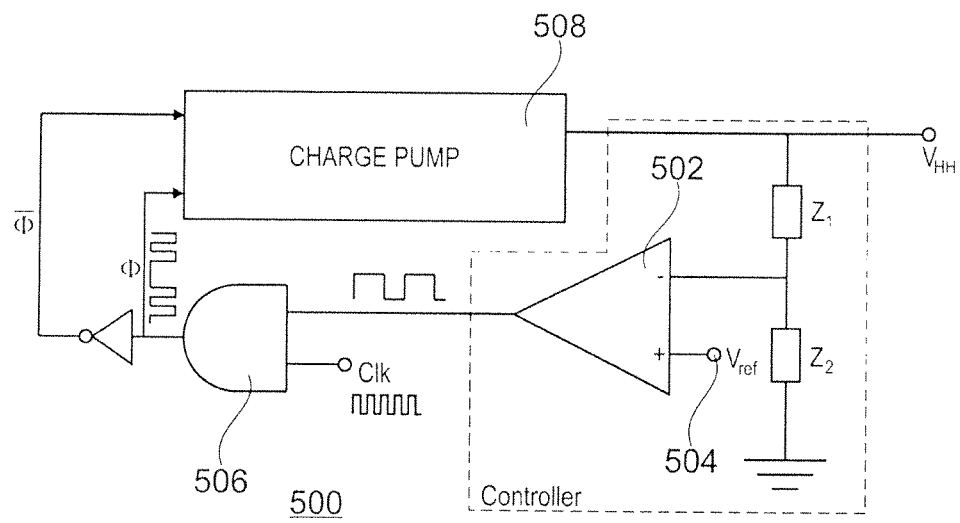
FIG. 5 shows an example of a conventional regulated charge pump configuration.

The actuation circuit part 108 of FIG. 1 includes a charge pump, and control circuitry configured to limit voltages across the capacitors and active devices below maximum tolerated values and to prevent the output voltage from varying unnecessarily with the input voltage. FIG. 5 shows an example of a conventional regulated charge pump configuration 500. In order to use a low-voltage reference, the output voltage of the charge pump HV is divided according to two impedances Z1 and Z2. The control means include also a comparator 502, a low-voltage reference supply 504, an AND operator 506, and a charge pump clock input 508.

Right after start-up of the charge pump operation, the divided value of $V_{HH}$ remains below Vref, and the output of the comparator 502 is high. This allows a clock signal Clk of the charge pump clock input 508 to drive the charge pump through phases $\phi$ and $\overline{\Phi}$, as described with FIG. 5. Now $V_{HH}$ increases until the comparator reaches a trip point, and blocks the clock signal from the charge pump. The charge-pump clocking will restart after the $V_{HH}$ has decreased due load current, triggered by the comparator 502. During a steady-state operation, the average voltage output from the charge pump thus stays at a value defined by the impedances $V_{ref}*(Z1+Z2)/Z2$.

Figure 6:
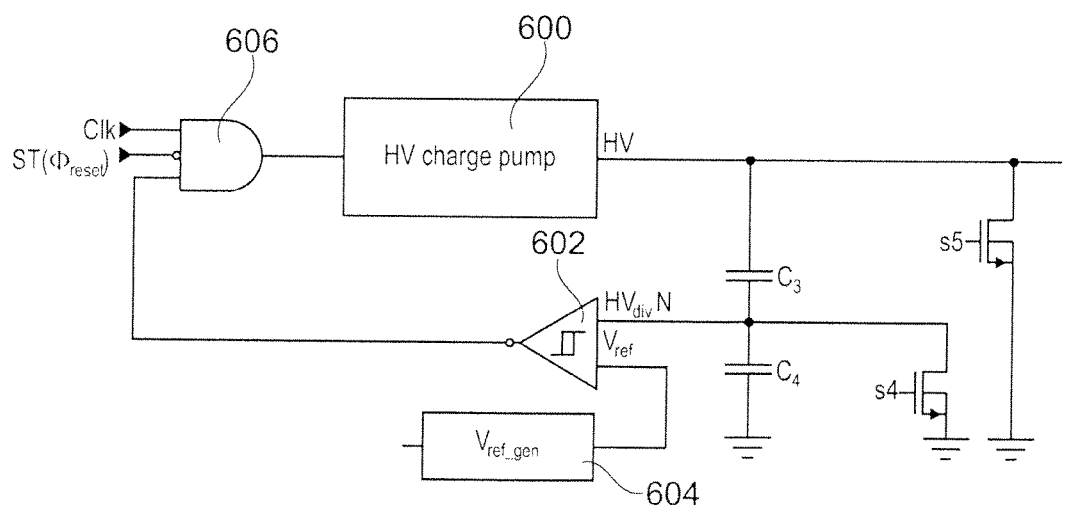
FIG. 6 illustrates an exemplary actuation circuit part of a sensor.

FIG. 6 illustrates an exemplary actuation circuit part 108 of the capacitive sensor of FIG. 1. As shown in FIG. 6, the actuation circuit part may include a charge pump 600, and a charge pump control circuitry including a comparator 602, a low-voltage reference 604 and an AND operator 606, as described in FIG. 5. The control circuitry may be made responsive to the self-test control signal $ST(\phi_{reset})$ such that enabling and disabling generation of the self-test actuating voltage HV depends on the self-test control signal $ST(\phi_{reset})$. In FIG. 6, an exemplary method of implementing the responsiveness is shown with an input of a self-test control signal $ST(\phi_{reset})$ to the AND operator 606. The state of the AND operator is not only dependent on the conventional comparator and clock inputs, described in FIG. 5. The AND operator may be further configured to enable the charge pump to an operational state and to an inactive state according to the self-test control signal $ST(\phi_{reset})$, i.e. to the operational state during reset periods when a self-test is run, and to the inactive state during readout periods when a self-test is run and during both periods when self-test is not run. In FIG. 6 the mechanism is implemented by an inverted input of the self-test control signal $ST(\phi_{reset})$ as shown in the following reset, table:

| self-test | $\phi_{read}$ | $\phi_{reset}$ | $ST(\phi_{reset})$ |
| --- | --- | --- | --- |
| 1 | 1 | 0 | 1 |
| 1 | 0 | 1 | 0 |
| 0 | 1 | 0 | 1 |
| 0 | 0 | 1 | 1 |

Due to the inversion, when a self-test is not run, the self-test control signal $ST(\phi_{reset})$ is ON, notwithstanding the state of the readout circuit part. When the self-test is run and the front end readout period $\phi_{read}$ is ON (i.e. the front end reset period $\phi_{reset}$ is OFF), the self-test control signal ST($\phi_{reset}$) is ON. When a self-test is run, and the front end readout period $\phi_{read}$ is OFF (i.e. the front end reset period $\phi_{reset}$ is ON), the self-test control signal ST($\phi_{reset}$) is OFF. When the self-test reset, control signal ST($\phi_{reset}$) is OFF, the charge pump is, in control of the charge pump control circuitry, enabled to generate a high-voltage input HV. It is understood that the logical operator and the inverted input scheme applied herein are exemplary only. Other mechanisms may be applied within the scope.

The actuation circuit part may also include switches s4 and s5 that are configured to reset the high-voltage net and the capacitive voltage division and the comparator during the front end readout period $\phi_{read}$ in order to implement direct current feedback for the charge-pump. When the capacitive voltage division is zeroed during reset, a desired voltage division ratio is maintained when the high-voltage output HV begins to rise.

In the exemplary structure of FIG. 6, the impedances are implemented with capacitors C3 and C4 such that the average voltage output from the charge pump converges a value defined by the capacitances $V_{ref}*(C3+C4)/C3$. The front end readout period $\phi_{read}$ is a clock phase that corresponds to a time instant when capacitive information is detected from the one or more capacitive elements. During the front end readout period $\phi_{read}$, high-voltage generation is never needed and the charge-pump may be in an inactive state. When a self-test is run, and a front end reset period $\phi_{reset}$ of the readout circuit part 104 begins, the charge pump control signal ST($\phi_{reset}$) may enable the AND-gate whereby the charge pump 600 begins to operate. After a number of charge pump clock Clk periods, the divided voltage output value (HVdivN) reaches a trip point of the comparator 602, the charge pump clock Clk is disabled, and the average voltage output from the charge pump stays at a value defined by the capacitances C3 and C4 until the end of the front end reset period $\phi_{reset}$. In the absence of resistive loads, the high-voltage output will not drop after clocking periods of the charge pump.

Accordingly, during a front end reset period $\phi_{reset}$, the high-voltage output HV may be used to create an electrostatic force that deflects the proof mass of the capacitive elements 100, 102 for self-testing of the capacitive sensor. In the example of FIG. 1, during a front end reset period $\phi_{reset}$, the first capacitive element 100 is grounded and the high-voltage output HV is coupled to the second capacitive element 102 and thereby actuates the proof mass. FIG. 2 shows that the charge pump of the actuation circuit part 106 raises the high-voltage output HV incrementally to a level and maintains the level until the front end readout period $\phi_{read}$ begins.

FIG. 2 illustrates two exemplary excitation schemes for the self-test. The level of the high-voltage output HV is determined by the length of a pump period, i.e. the time from the beginning of the front end reset period $\phi_{reset}$ to the time the divided voltage output value (HVdivN) during a self-test reaches the trip point of the comparator 602, and the charge pump clock Clk is disabled. The length of the charge pump clock period can be controlled with the level of the reference voltage $V_{ref}$. CP clk_1 illustrates a shorter pump period during which the high-voltage output HV reaches a lower level, and CP_clk_2 a longer pump period during which the charge pump is on for a longer period and the HV the high-voltage output HV reaches a higher level.

Figure 7:
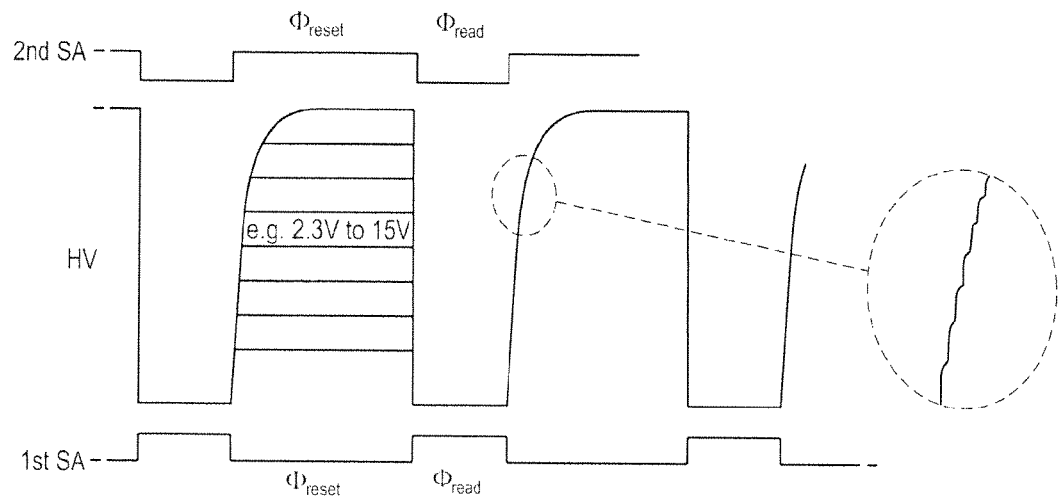
FIG. 7 illustrates exemplary waveforms of a high-voltage output.

FIG. 7 illustrates exemplary waveforms of the time-discrete high-voltage output HV. The curves $1^{st}$ SA and $2^{nd}$ SA illustrate switching states of the readout circuit part and the actuation circuit part, respectively, in time. The resolution of the attained high-voltage output HV value depends on the slew rate of the charge-pump 600 i.e. the incremental increase per a charge pump clock Clk transition, the precision of the capacitive voltage division HVdivN, comparator delay and delays in the charge pump clock Clk path. The comparator 602 may be designed in such a way that after the trip point of the comparator is reached, the comparator output value cannot change before the next front end reset period $\phi_{reset}$.

It is also possible to control the rise time of the high-voltage output. For example, precision of the high-voltage output signal can be increased by making the rise time deliberately slower for low high-voltage targets. This may be achieved by adding extra capacitive load to the high-voltage output node, which decreases the size of the high-voltage increment in a charge pump cycle. With the smaller step size, also the effects of comparator delay are reduced and the desired high-voltage level is achieved more accurately.

Advantageously, the clock rate of the pump (frequency of Clk) is significantly higher than the switching rate between the reset and readout periods ($\phi_{reset}$, $\phi_{readout}$). Typically detection rates during self-tests are of the order of 10-100 kHz, while at least 10 MHz clock frequency for the charge-pump can be used. The capacitive sensor may thus include a first clock pulse engine configured to run the front end readout periods and the front end reset periods in anti-phase and in a first frequency, and a second clock pulse engine configured to run the switched capacitor charge pump in a second frequency. The ratio of the first frequency and the second frequency may then be advantageously of the order of 1:100 or more.

Figure 13:
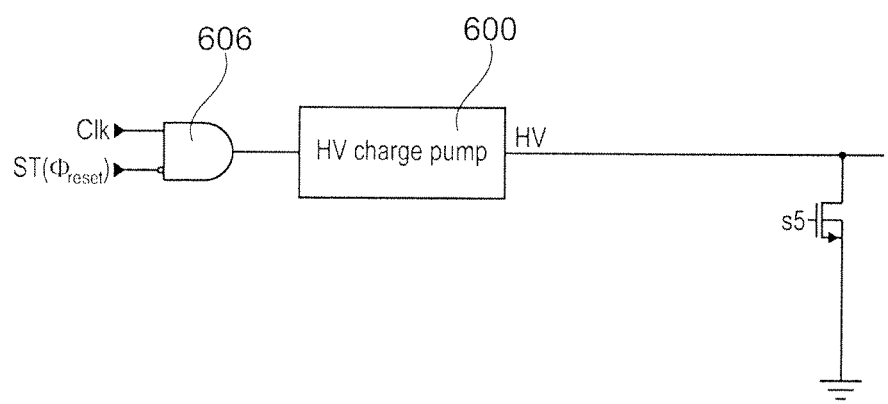
FIG. 13 illustrates another exemplary actuation circuit part of a sensor.

In another embodiment, illustrated in FIG. 13, the charge pump control circuitry for enabling and disabling generation of the self-test bias voltage (HV) may be implemented without a control loop as described above, but with a reset circuitry such as an AND operator (606) allowing running the charge pump (600) while the self-test control signal ST($\phi_{reset}$) is OFF. As understood by a person familiar with the art, the polarity of the self-test control signal ST($\phi_{reset}$) may be changed by selecting a non-inverting input gate of an AND operator (606) for the self-test control signal. Setting the clock rate of the pump (frequency of Clk) suitably in relation to the length of the OFF period of the self-test control signal ST($\phi_{reset}$), the maximum output voltage of the charge pump (600) reaches the intended self-test voltage (HV) during the self-test control signal ST($\phi_{reset}$) OFF period, but does not exceed the intended self-test voltage (HV) level. The charge pump enable input can also be used to control the number of self-test bias voltage (HV) pulses fed to the capacitive element, in which case the self-test bias voltage (HV) can be higher compared with infinitely repeated ST($\phi_{reset}$) OFF pulses. This functionality is achieved by monitoring the capacitance value read from the capacitive element at each front-end readout period ($\phi_{read}$) and disabling the charge pump (600) by manipulating either Clk or ST($\phi_{reset}$) when a sufficient capacitance shift of the capacitive element is achieved. In other words, the ST($\phi_{reset}$) and/or Clk input may be designed to control the number of self-test bias voltage (HV) generation pulses fed into the charge pump in such a way that charge-pump operation is completely off, i.e. no clock is entering the charge-pump, when self-test bias voltage (HV) generation is disabled after achieving the sufficient capacitance shift. An additional switch arrangement (s5) may be arranged in the actuation circuitry to reset the high-voltage during the front-end readout period ($\phi_{read}$) in order to ensure zero output during the readout periods ($\phi_{read}$). This prevents any leakage and other parasitic effects that may result due to the floating charge pump output (HV). The reset arrangement may also be used to zero the charge pump output before entering the front-end readout period ($\phi_{read}$) in such a way that high voltage is not inflicting excess stress to the readout circuitry.

The capacitive sensor includes at least one microelectromechanical element where one or more capacitive elements may be coupled together for joint detection in the electrical domain. The capacitive sensor may also include two or more microelectromechanical elements used, for example, for detection in different directions, or to provide two or more signals in one direction for improved robustness and/or accuracy. One important aspect of the self-test functionality is multiplexing, i.e. the ability to apply one and same high-voltage source for self-tests of more than one, preferably for self-tests of all capacitive elements in the capacitive sensor.

Figure 8:
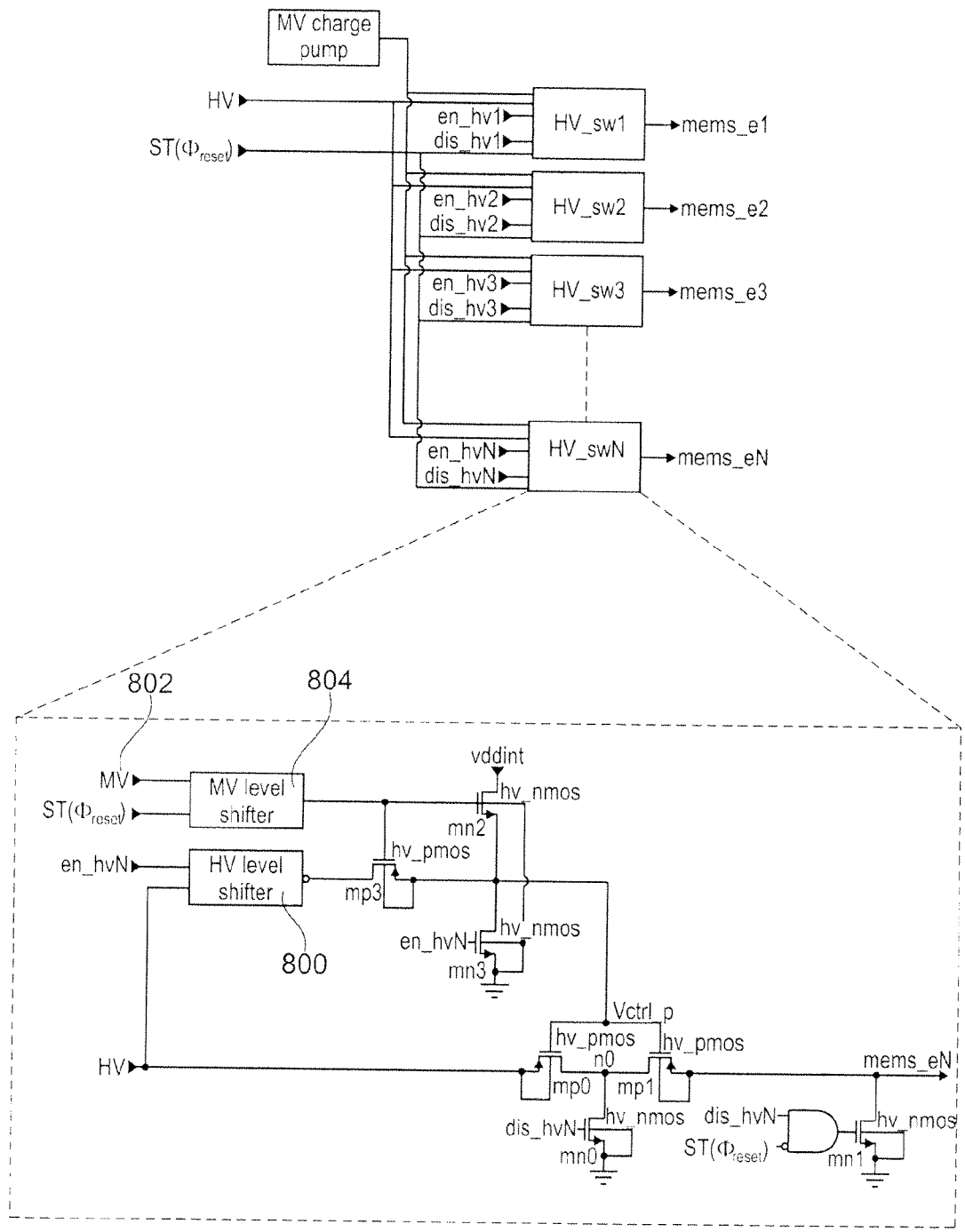
FIG. 8 illustrates an exemplary multiplexing configuration.

FIG. 8 illustrates an exemplary multiplexing configuration applicable in embodiments of the invention. The configuration includes N capacitive elements mems_e1, mems_e2, . . . , mems_eN. High-voltage input HV, corresponding to the time-discrete high-voltage output HV produced by the charge pump, which is input to the capacitive elements (typically to stators of the capacitive elements) is controlled by element HV switches HV_sw1, HV_sw2, . . . , HV_swN according to element HV switch control signals en_hv1, en_hv2, . . . , dis_hvN and dis_hv1, dis_hv2, . . . , dis_hvN. In conventional systems, high-voltage input HV is continuously on, and transitions of switch states tend to cause undesired transient effects. For example, element HV switches typically include level shifters and/or logic gates that are coupled to a high-voltage source. These are very challenging to design for varying high-voltage values in such a manner that level shifting operation is functional but switching does not draw significant current from the high-voltage source.

Figure 9:
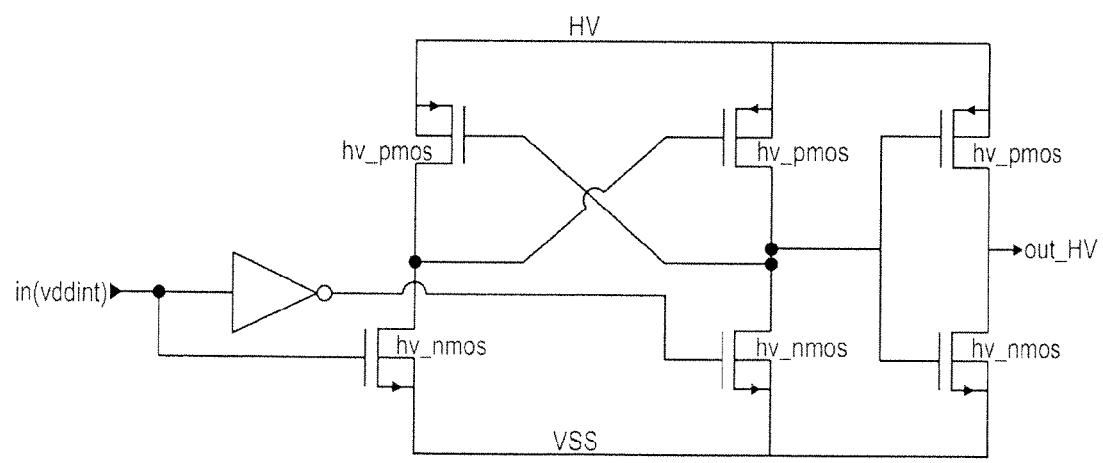
FIG. 9 illustrates elements of an exemplary inverting level shifter element.

FIG. 9 illustrates elements of an exemplary inverting level shifter element that converts an internal supply voltage domain signal in(vddint) to a high-voltage level signal out_HV. Considering a typical example case when HV is at value larger than vddint and the input signal in(vddint) changes, the level shifter output changes as well. During transition the hv-pmos and hv_nmos transistors conduct, and a current pulse is drawn from the HV supply. Though the duration of the pulse is short, it may shift the high-impedance HV supply considerably and increase the HV current consumption. By use of the time-discrete form of the high-voltage input HV, this disadvantage is now avoided. In embodiments, the HV and in(vddint) may be synchronized such that state transitions take place only when the high-voltage input HV is zero.

Returning to FIG. 8, an element HV switch may include a high-voltage level shifter 800 that is configured to use the high-voltage input HV as its supply voltage, and output its shifted output voltage as a control signal Vctrl_p. The control signal Vctrl_p may then be used with pass-transistors mp0 and mp1 to enable and disable supply of the high-voltage input HV to the capacitive element mems_eN. Now that the high-voltage input HV during the self-test is time-discrete, varying as shown in FIG. 7, the level shifter supply voltage HV is not continuous, but assumes zero value during the front end readout periods $\Phi_{read}$. Also the logic input change transients of the high-voltage level shifter occur during these zero supply voltage periods. Accordingly, even if all transistors in a level shifter would temporarily be in a conductive state at the same time, no current pulse nor related HV voltage deviation is created.

In time-discrete multiplexed operation, an element HV switch may be configured to operate in three separate states. A first state relates to times when no high-voltage input is supplied, i.e. to periods when the self-test is not run, and to front end readout periods during the self-test. A second state relates to front end reset periods $\Phi_{reset}$ when a self-test is run, and high-voltage input HV needs to be fed to deflect the particular capacitive element of the element HV switch. A third state relates to front end reset periods $\Phi_{read}$ when a self-test is run, but the high-voltage input HV is to be fed to deflect another capacitive element in the capacitive sensor, not the one of the element HV switch.

These states may be managed in element HV switches with simple combinations of control signals. FIG. 8 illustrates an example of operations in an element HV switch that controls high-voltage supply to a capacitive element mems_eN with an element-specific control signal en_hvN/dis_hvN, and a common self-test control signal ST($\phi_{reset}$) introduced in FIG. 6. The element-specific control signal en_hvN/dis_hvN may be set, for example, with a further user controlled signal through the self-test controller 112 of FIG. 3. The common self-test control signal ST($\phi_{reset}$) is ON during periods when the high-voltage input is zero, i.e. during periods when self-test is not run, and during front end readout periods $\phi_{read}$ when the self-test is run (the first state).

The two logical states of the element-specific signal are represented in Figure with signals en_hvN (capacitive element N to be deflected) and dis_hvN (capacitive element other than N to be deflected). In the configuration of FIG. 8, the three states may thus be operated as follows:

| State | dis_hvN | en_hvN | ST($\Phi$reset) | HV | Vctrl_p | mems_eN |
| --- | --- | --- | --- | --- | --- | --- |
| 1 | 1 | 0 | 1 | vss | vddint | highZ |
| 2 | 0 | 1 | 0 | HV | vss | HV |
| 3 | 1 | 0 | 0 | HV | HV | vss |

When a self-test is run, during the front end reset period $\phi_{reset}$ of the capacitive sensor, the non-zero high-voltage input HV to the capacitive element is controlled by a respective element HV switch. As shown in FIG. 8, when a control signal Vctrl_p generated in the element HV switch is vss (0 V), transistors mp0, mp1 are in a conducting state and the high-voltage input HV is fed to the capacitive element (the second state). When the control signal Vctrl_p is high (HV), transistors mp0, mp1 are in a non-conducting state, transistor mn1 pulls the high-voltage input node to the ground so that the HV switch blocks the high-voltage input from the capacitive element (the third state).

It is possible to bias the pass-transistors mp0 and mp1 to an internal supply voltage vddint, and thereby secure that they remain in a non-conductive state during front end readout periods (the first state). The vddint biasing may be controlled by a transistor mn2. In order to appropriately operate the transistor mn2, a medium-voltage charge pump 802 may be used to provide a voltage higher than vddint. The element HV switch may thus include a medium-voltage charge pump 802, and a medium-voltage level shifter 804. The self-test control signal ST($\phi_{reset}$) may be used to enable or disable the medium-voltage input MV of the medium-voltage charge pump 802. The medium-voltage level shifter 804 output may be used to enable or disable switch mn2 and thereby connect vddint bias to or prevent vddint bias from the pass-transistors mp0 and mp1. The non-zero bias keeps gates of the series pmoses mp0, mp1 reliably in a high-resistive mode, and ensures that the capacitive element mems_eN is left floating during the first state.

Advantageously, the medium voltage charge pump 802 is configured to consume as little current as possible. In the example of FIG. 8, the medium voltage charge pump 802 is on also when the self-test is not run. To minimize current consumption, the clock of the medium-voltage charge pump may be synchronized to the front end reset and readout periods so that the medium-voltage value becomes updated during front-end reset phases and thus does not interfere with the readout operation. During self-test, on the other hand, the medium voltage charge pump may be clocked at a higher rate to ensure short rise-times during readout phase. The medium-voltage charge pump may thus be coupled to a third clock pulse engine such that when self-test is disabled the third clock pulse engine is synchronized to the reset and readout periods so that output value becomes updated during front-end reset phases. When self-test is enabled the third clock pulse engine applies a clock rate significantly higher than the rate of change of the front end reset and readout periods. For example, a same clock rate may be applied for the medium voltage charge pump and the high-voltage charge pump.

The medium-voltage level shifter 804 output may be used to enable or disable switch mp3 and thereby to connect the high-voltage input HV as the control signal Vctrl_p to the pass-transistors mp0 and mp1, or to disable it. The switch mp3 is in a conducting state when the MV level shifter output is lower than the inverted HV level shifter output (the third state). In those situations, the high-voltage input HV becomes the control signal Vctrl_p and blocks the high-voltage input from the capacitive element (the third state). The switch mp3 also prevents vddint leaking to the HV level shifter during the first state operation.

A switch mn3 enabled and disabled by the element-specific control signal en_hvN/dis_hvN may be used to zero the control signal Vctrl_p and shift the series pmos switches mp0, mp1 to a conducting state, and thereby enable the second state of operation.

A reset transistor mn0 enabled and disabled by the element-specific control signal dis_hvN may be included to improve isolation of the high-voltage input of one capacitive element from other multiplexed capacitive elements. Furthermore, the reset transistor mn0 prevents the bulk diode of series pmos from conducting during the first state operation, i.e. when the high-voltage input HV is zero and capacitive element is in non-zero potential.

Accordingly, division of the time-discrete high-voltage to a number of capacitive elements can be controlled with a compact switching configuration and with minimal transient effects.

Figure 10:
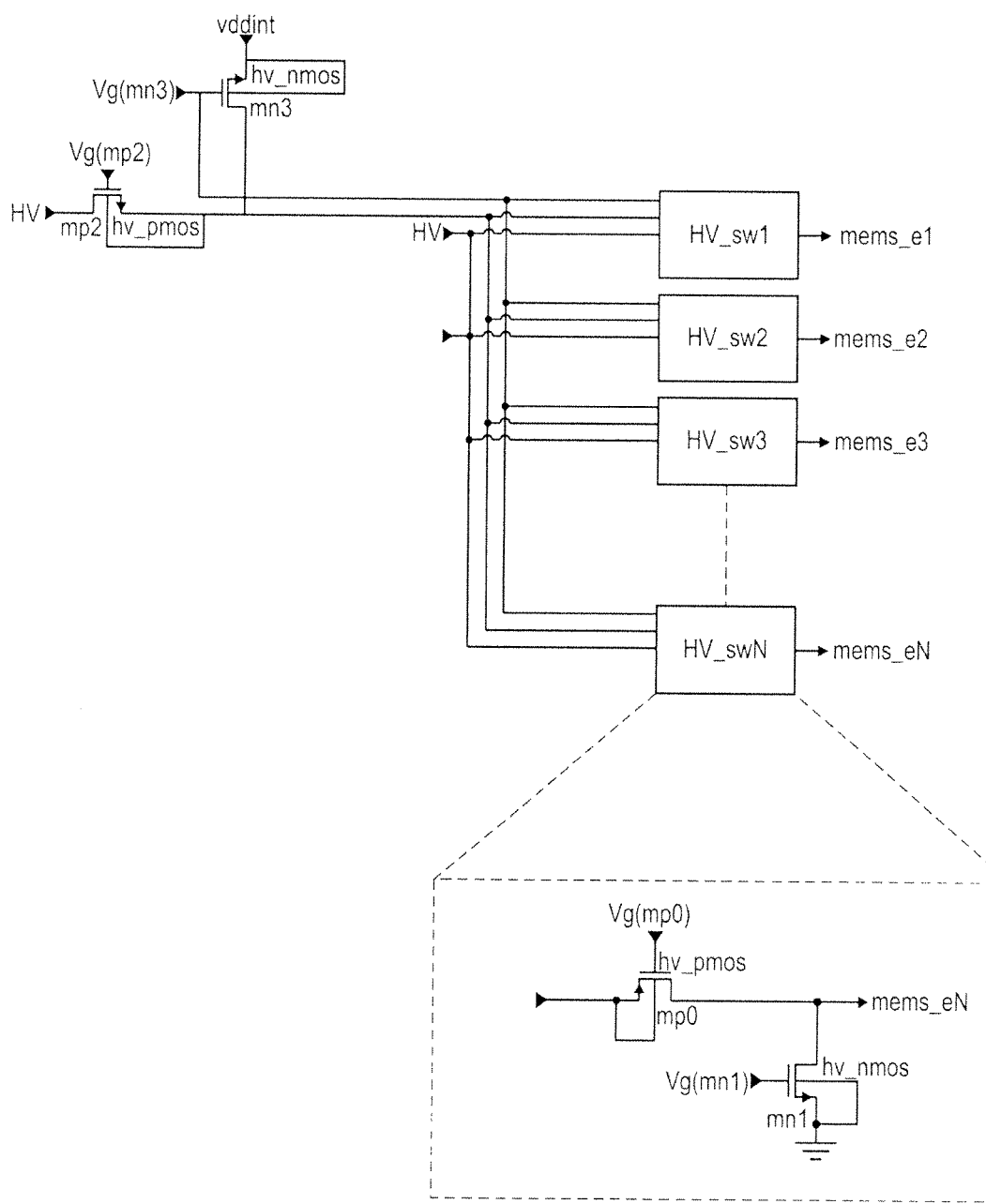
FIG. 10 illustrates an alternative multiplexing configuration.

In some embodiments, the time-discrete high-voltage supply needs to be used with elements that have a limited gate oxide voltage tolerance, for example drain extended devices. In such cases, multiplexing of the high-voltage supply cannot be controlled with level shifters as shown in FIG. 8, because the resulting gate-source voltage would destroy or at least considerably reduce the lifetime of the switch transistors. FIG. 10 illustrates an alternative multiplexing configuration applicable in embodiments of the invention. Again, the configuration includes N capacitive elements mems_e1, mems_e2, . . . , mems_eN, and the high-voltage input HV to the capacitive elements is controlled by element HV switches.

The high-voltage input HV may be generated with the charge pump configuration of FIG. 6. As described with FIG. 8, the time-discrete high-voltage input HV can in a straightforward way be taken into use for controlling the multiplexed operations. Multiplexing transistors mp0 and mn1 that enable and disable supply of HV to the capacitive element, an isolating transistor mp2, and one or more controlling transistors mn3 that provide a non-zero bias for the periods of zero high-voltage input may be applied in a manner described with FIG. 8 to manage the three possible states of operation. An important design principle is, however, that the gate-source voltages Vg(mn1), Vg(mp0), Vg(mn3) and Vg(mp2) of the applied transistor switches mp0, mn1, mp2, mn3 must never exceed given tolerance limits. In order to ensure this, additional elements may be included in the configuration. Control mechanisms of the configuration of FIG. 10 are described in more detail in the following with FIGS. 11A to 11C.

Figure 11A:
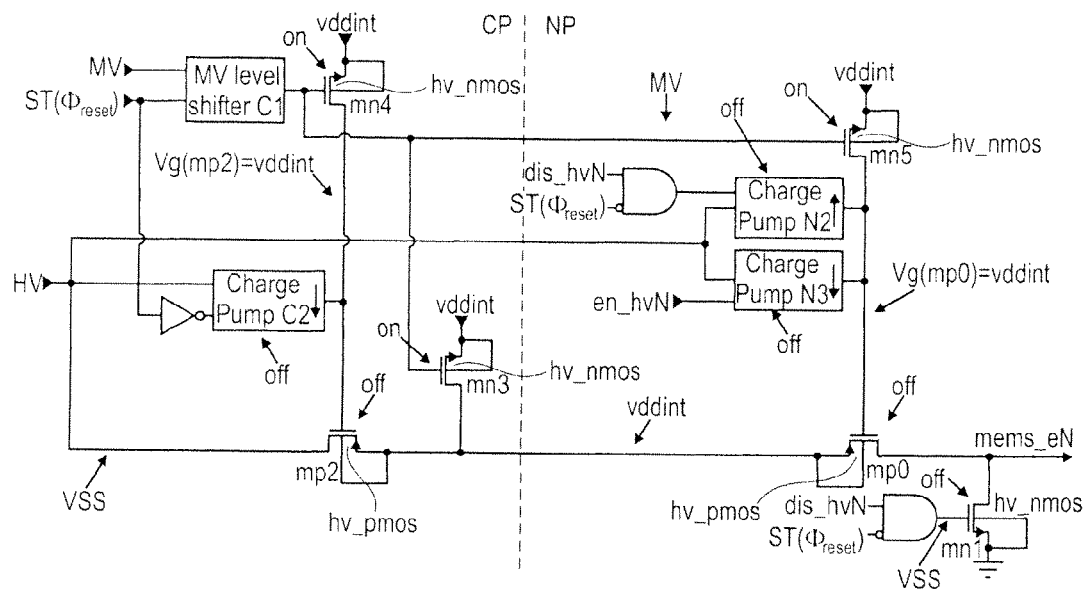
FIGS. 11A to 11C illustrate control mechanisms of the configuration of FIG. 10.
Figure 11B:
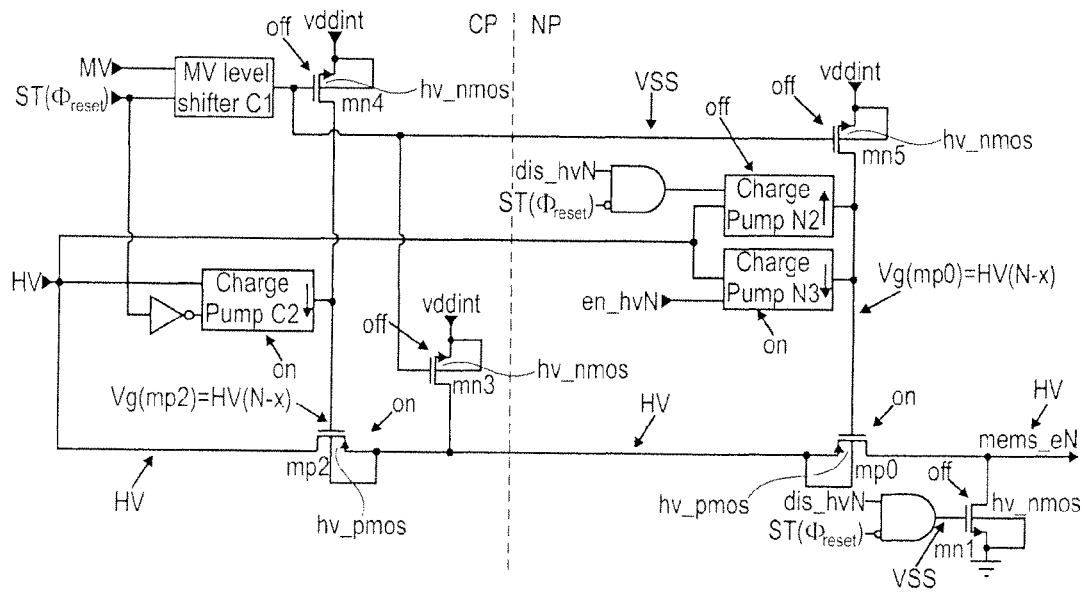
Figure 11C:
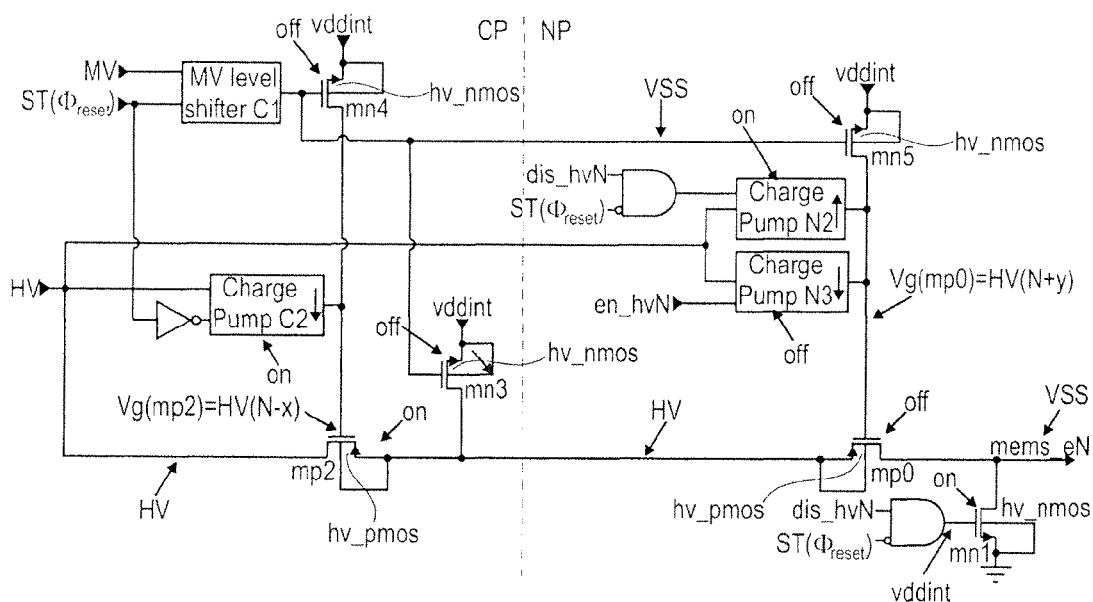

A dashed line in the example configuration of FIGS. 11A to 11C divides the switching elements into a common part CP and a node part NP such that elements in the common part CP may be shared by all capacitive element nodes and elements in the node part NP need to be replicated separately for individual capacitive element nodes. The three states discussed earlier with the configuration of FIG. 8 may be implemented as follows:

| State | dis_hvN | en_hvN | ST(Φreset) | HV | mems_eN | Vg(mp0) | Vg(mn1) | Vg(mp2) | Vg(mn3/4/5) |
|---|---|---|---|---|---|---|---|---|---|
| 1 | 1 | 0 | 1 | vss | highZ | vddint | vss | vddint | MV |
| 2 | 0 | 1 | 0 | HV | HV | HV(N − x) | vss | HV(N − x) | vss |
| 3 | 1 | 0 | 0 | HV | vss | HV(N + y) | vddint | HV(N − x) | vss |

FIG. 11A relates to the first state, i.e. to operational periods when the self-test is not run, and to operational periods when the self-test is run but the readout period is on. As described with FIG. 8, the high-voltage input HV is zero (vss) and the capacitive element is left floating. The switches mn3, mn4 and mn5 controlled by a medium-voltage input MV and a medium voltage level shifter C1 enable supply of non-zero bias vddint as control signals Vg(mp2) and Vg(mp0) to gates of transistors mpg and mp0 respectively, to ensure that they remain in a high-resistive mode.

FIG. 11B relates to the second state, i.e. to operational periods when the self-test is run, the high-voltage input HV is supplied and is to be connected to the capacitive element. The switching elements may include lowering floating charge pumps C2, N3 that are configured to generate adjusted control signals Vg(mp0) and Vg(mp2) that are below the input HV level. In FIG. 11B, a lowering floating charge pump C2 in the common part provides an adjusted lower control signal voltage level HV(N−x) to the control signal Vg(mp2) of the transistor mpg, and a lowering floating charge pump N3 in the node part an adjusted lower control signal voltage level HV(N−x) to the control signal Vg(mp0) of the multiplexing transistor mp0. The number of stages needed in lowering floating charge pumps depends on thresholds and gate-source tolerances of the respective served transistors. Typically one to two stages is already sufficient to achieve desired control signal voltage levels.

FIG. 11C relates to the third state, i.e. to operational periods when the self-test is run, the high-voltage input HV is supplied, but is not to be connected to the capacitive element. In order to drive mp0 to non-conductive state, the node part of the switching elements may include a boosting floating charge pump N2 that is configured to turn on in the third state and generate for control signal Vg(mp0) of the multiplexing transistor mp0 an adjusted control signal voltage level HV(N+y) that is equal or above the input HV level. The multiplexing transistor mp0 becomes non-conductive and the high-voltage input HV is not connected to the capacitive element. In the third state, the transistor mn1 is enabled and pulls the capacitive element to ground.

The time-discrete approach of the present invention thus enables a streamlined and non-complex switching mechanism that can have very area optimized implementations even in multiplexed element configurations. The area optimization is achieved by taking advantage of the discrete-time nature of the readout circuitry interface. This way the charge pump reset and control scheme can be designed so that DC current load of the charge pump remains very small, while multiplexing of single charge pump output to several isolated stator electrodes is possible. Absence of large resistors in the charge pump ensures that charge pump area consumption remains low for two reasons: firstly, large resistors take considerable area and secondly, resistors consume DC current which forces to increase the area of the charge pump. The switching mechanism adapts also easily for implementations where components with limited voltage tolerances are used. This is made possible by introducing the floating charge pumps (C2, N2, N3) which allow the gate bias voltage (Vg(mp0), Vg(mp2)) of floating transistors (mp0, mp2) to be biased only the required amount below or above the output self-test bias voltage (HV) value. Typically, when only one or maximum two stages is required for these auxiliary floating charge pumps (C2, N2, N3) and load is determined by the driven gates, these floating charge pumps (C2, N2, N3) do not significantly increase the area.

Figure 12:
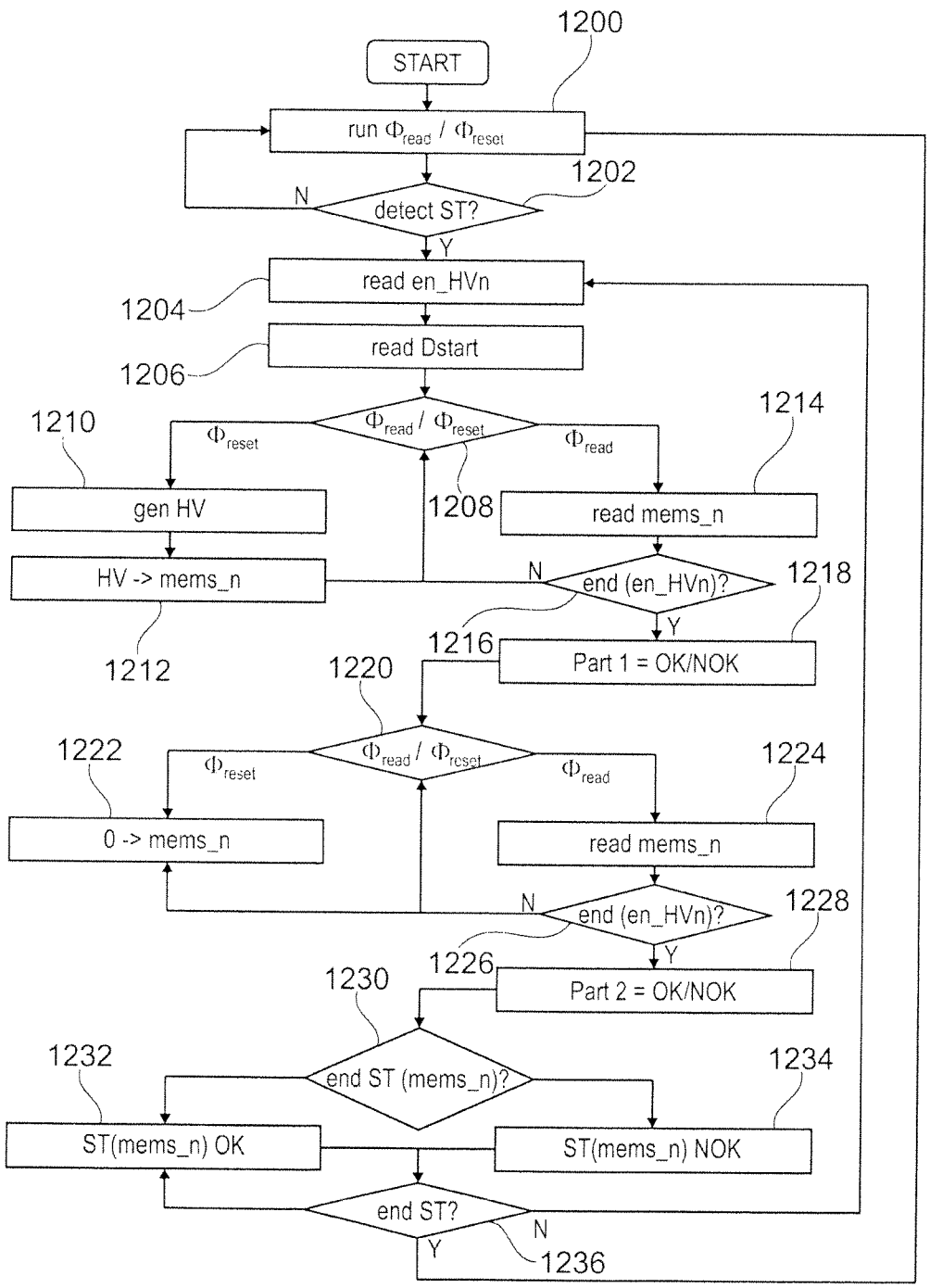
FIG. 12 illustrates stages of an exemplary self-test method that may be applied in a capacitive sensor.

FIG. 12 illustrates stages of an exemplary self-test method that may be applied with capacitive sensor structures according to FIGS. 1 to 11. The process starts in a situation where the capacitive sensor is in normal operation and the front end readout and reset periods of the readout circuit part are running periodically in the capacitive sensor (stage 1200). The capacitive sensor is also responsive to detect a trigger signal that enables self-test operation of the capacitive sensor (stage 1202). As long as no such trigger signal is detected, the capacitive sensor may stay in normal operation of stage 1200. If the trigger signal is detected, the capacitive sensor begins a self-test operation. If the structure included only one capacitive element, stage 1204 could be omitted. However, typically a capacitive sensor includes several capacitive elements to be tested, and for such situations, the capacitive sensor may be configured to detect an element-specific control signal en_hvN/dis_hvN (stage 1204) that indicates which one of the capacitive elements is to be tested. In order to create a reference value for the test, measured values Dstart at the time before the actuation may be stored (stage 1206). After this, the self-test may progress in alternating front end readout periods and front end reset periods (stage 1208).

It is known to be very difficult to create a precisely acceleration resembling test signal using high-voltage excitation. Instead, it is more feasible to verify using the high voltages that the proof-mass moves the required full-scale range in a specified time frame, and that the capacitive sensor returns to the condition prior to the excitation with a specified accuracy and speed after the excitation is removed. For example, it is possible to define a target deflection and stop the self-test right when this deflection is achieved by the capacitive element. The high-voltage bias may be set to be somewhat higher (10-20%) than an estimated voltage for the actual desired deflection, and the decision to stop the self-test may be made immediately when the desired deflection is achieved. The time needed to achieve the desired deflection and to return back to the zero deflection may also be used as an indication on the state of the tested capacitive element. This arrangement reduces the need for accurate high-voltage levels and thus significantly simplifies the self-test implementation.

Accordingly, in a first sub-test of the self-test of a selected capacitive element, the capability to respond to the actuation may be tested. For this, during the front end reset periods $\Phi_{reset}$, generation of the self-test bias voltage HV is triggered (stage 1210), and switching arrangements within the capacitive sensor couples the self-test bias voltage HV to the selected capacitive element (stage 1212). This procedure may continue during the reset periods, as long as the self-test of the selected capacitive element is on.

During the corresponding front end readout periods ($\Phi_{read}$), deflection of the tested capacitive element is detected (stage 1214). The measured data is compared (stage 1216) to a defined deflection test end condition to determine whether the first sub-test is to be ended. The end may be triggered, for example, when the measured deflection reaches a defined threshold value, or when a predefined actuation test interval is reached.

In the end of the first part, the result of the first sub-test may be recorded (stage 1218). For example, if the first sub-test ends by the measured deflection reaching the defined threshold value, the first sub-test may be considered to be successful (part1 is OK). Correspondingly, if the first sub-test ends by the actuation test interval ending before the measured deflection reaches the defined threshold value, the first sub-test may be considered to indicate failure (part1 is NOK). Alternatively, it is possible to define a target time range during which the defined threshold deflection should be reached, and record the actual time period in which the defined threshold deflection is reached. If the actual time period is not within the target time range, the first sub-test may be considered to indicate failure, even if the actuation test interval is not exceeded.

In the second sub-test of the self-test it is possible to test whether the selected capacitive element returns appropriately back to the initial condition. Accordingly, in the second sub-test of the self-test of the selected capacitive element, the self-test may again progress in alternating front end readout periods and front end reset periods (stage 1220). However, this time the switching arrangements within the capacitive sensor are configured to block the self-test bias voltage (HV) from the selected capacitive element (stage 1222). This means that there is no electrostatic force to create the deflection and the measured values should approach the initial measured values Dstart stored at the time before the actuation.

Accordingly, again during the corresponding front end readout periods $\Phi_{read}$, the deflection of the tested capacitive element is detected (stage 1224). The measured data is compared (stage 1226) to a defined return test end condition to determine whether the second sub-test is to be ended. The end may be triggered, for example, when the measured values reach, within calibrated precision, the initial measured values Dstart, or when a predefined return test interval is reached.

In the end of the second part, the result of the second sub-test may be recorded (stage 1228). For example, if the second sub-test ends by the measured values corresponding to the initial measured values Dstart, the second sub-test may be considered to be successful (part2 is OK). Correspondingly, if the second sub-test ends by the return test interval ending before measured values reach the initial measured values Dstart, the second sub-test may be considered to indicate failure (part2 is NOK). Alternatively, it is possible to define a target time range during which the initial measured values Dstart should be reached, and record the actual time period in which the initial measured values Dstart is reached. If the actual time period is not within the target time range, the second sub-test may be considered to indicate failure, even if the return test interval is not exceeded.

After the first sub-test and the second sub-test of the self-test of the selected capacitive element, the results of the partial tests are checked, and the total result for the tested capacitive element is recorded (stage 1230). For example, the capacitive element may be considered to pass the test successfully (stage 1232), if both the first sub-test and the second sub-test are successful. Correspondingly, the capacitive element may be considered to fail the test (stage 1234), if either of the first sub-test and the second sub-test fails.

After the self-test of a selected capacitive element, it is checked whether the self-test operation is to end (stage 1236). If yes, the sensor returns to normal operation (stage 1200). If not, testing of another capacitive element may be started (stage 1204).

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A capacitive sensor, comprising:
   at least one capacitive element;
   a switched-capacitor readout circuit configured to detect at least one signal capacitance that results from motions of the at least one capacitive element;
   a first switch arrangement configured to electrically couple the switched-capacitor readout circuit part to the at least one capacitive element for a front end readout period, and to electrically decouple the switched-capacitor readout circuit part from the at least one capacitive element for a front end reset period;
   a self-test controller configured to enable and disable a self-test of the capacitive sensor;
   an actuation circuit configured to generate a self-test bias voltage for electrostatic deflection of the at least one capacitive element;
   a second switch arrangement configured to electrically couple the self-test bias voltage of the actuation circuit part to the at least one capacitive element during a first period, wherein the first period is synchronized to the front end reset period and is configured to occur when the self-test of the capacitive sensor is enabled by the self-test controller, and to electrically decouple the actuation circuit part from the at least one capacitive element in times other than the first period,
   wherein the actuation circuit includes a high-voltage charge pump and a high-voltage charge pump control circuitry configured to enable and disable generation of the self-test bias voltage by the high-voltage charge pump,
   wherein the second switch arrangement is configured to generate a self-test control signal, a first state of the self-test control signal relating to the first period, and the second state of the self-test control signal relating to the times other than the first period, and
   wherein the high-voltage charge pump control circuitry is responsive to the self-test control signal such that enabling and disabling generation of the self-test bias voltage by the high-voltage charge pump depends on the self-test control signal.

2. The capacitive sensor according to claim 1, wherein the capacitive sensor includes:
   a first clock pulse engine configured to run the front end readout period and the front end reset period in anti-phase and in a first frequency;
   a second clock pulse engine configured to run the high-voltage charge pump in a second frequency; and
   a high-voltage charge pump control circuitry responsive to the self-test control signal configured to enable the second clock pulse engine in the first period.

3. The capacitive sensor according to claim 2, wherein the high-voltage charge pump control circuitry includes a capacitive voltage division, wherein the high-voltage charge pump control circuitry is configured to disable the second clock pulse engine in response to the capacitive voltage division reaching a defined threshold value.

4. The capacitive sensor according to claim 3, further comprising a first high-voltage charge pump switch arrangement configured to zero the capacitive voltage division in times other than the first period.

5. The capacitive sensor according to claim 3, further comprising a second high-voltage charge pump switch arrangement configured to zero the self-test bias voltage output in times other than the first period.

6. The capacitive sensor according to claim 2, wherein the ratio of the first frequency and the second frequency is 1:100.

7. The capacitive sensor according to claim 1, further comprising:
   at least one pair of capacitive elements, each including a variable capacitor, the capacitive elements forming a capacitive half bridge,
   wherein the self-test bias voltage is coupled to induce opposite deflections of the capacitive elements.

8. The capacitive sensor according to claim 1, further comprising:
   two or more capacitive elements;
   element switches configured to control coupling of a common self-test bias voltage separately to the two or more capacitive elements,
   wherein logic input changes of the element switches are configured to occur during the front end readout periods.

9. The capacitive sensor according to claim 8, wherein at least one element switch of the element switches includes:
   one or more first control transistors configured to enable or disable coupling of the self-test bias voltage to the capacitive element according to a control signal; and
   a high-voltage level shifter configured to use the time-discrete self-test bias voltage as a supply voltage to generate a shifted time-discrete voltage for use as the control signal of the first control transistors.

10. The capacitive sensor according to claim 8, wherein at least one element switch of the element switches includes
    one or more first control transistors configured to enable or disable coupling of the self-test bias voltage to the capacitive element according to a control signal; and at least one floating charge pump coupled to the high-voltage charge pump output to generate a raised or lowered time-discrete voltage for use as the control signal of the one or more first control transistors.

11. The capacitive sensor according to claim 9, wherein the element switch further includes a switch control circuitry responsive to the self-test control signal to enable the control signal to the one or more first control transistors during the first period, and disable the control signal the one or more first control transistors during times other than the first period.

12. The capacitive sensor according to claim 11, wherein the switch control circuitry includes components configured to bias the first control transistors to an internal supply voltage during front end readout periods, the internal bias supply voltage being lower than the self-test bias voltage.

13. The capacitive sensor according to claim 12, wherein said components include one or more second control transistors for controlling supply of the internal supply voltage, and a medium-voltage supply for controlling switching by the second control transistors.

14. The capacitive sensor according to claim 13, wherein the element switch is configured to input the self-test control signal, a first state of the self-test control signal relating to the first period, and the second state of the self-test control signal relating to the times other than the first period, and
wherein the medium-voltage supply to the second control transistors is enabled or disabled according to the state of the self-test control signal.

15. The capacitive sensor according to claim 14, wherein the medium-voltage supply includes a medium-voltage charge pump,
the medium-voltage charge pump is coupled to a third clock pulse engine,
when self-test is disabled the third clock pulse engine is synchronized to the reset and readout periods so that output value of the medium-voltage charge pump becomes updated during front-end reset phases, and wherein
when self-test is enabled the third clock pulse engine applies a clock rate higher than the rate of change of the front end reset and readout periods.

16. The capacitive sensor according to claim 15, wherein the second clock pulse engine is also configured to be used as a third clock pulse engine.

17. The capacitive sensor according to claim 1, further comprising a third switch arrangement, synchronized to the readout periods of the first switch arrangement and configured to reset the readout circuit part in the beginning of each readout period, before occurrence of a read pulse of the readout period.

18. A self-test method for a capacitive sensor that includes at least one capacitive element, a switched-capacitor readout circuit part for detecting at least one signal capacitance that results from motions of the at least one capacitive element, and a first switch arrangement configured to electrically couple the switched-capacitor readout circuit part to the at least one capacitive element for a front end readout period, and to electrically decouple the switched-capacitor readout circuit part from the at least one capacitive element for a front end reset period, the method comprising:
generating in the capacitive sensor a self-test bias voltage for electrostatic deflection of the at least one capacitive element during a first period, wherein the first period is synchronized to the front end reset period and is configured to occur when the self-test of the capacitive sensor is enabled;
electrically decoupling the self-test bias voltage from the at least one capacitive element in times other than the first period;
generating a self-test control signal, wherein a first state of the self-test control signal relates to the first period, and the second state of the self-test control signal relates to the times other than the first period; and
enabling and disabling generation of the self-test bias voltage by the high-voltage charge pump in response to the self-test control signal.

19. The method according to claim 18, further comprising:
measuring the self-test bias voltage induced deflection of the at least one capacitive element during the front end readout period during the self-test;
comparing the measured deflection to a predefined deflection target value; and
determining the state of the at least one capacitive element based on the comparison.

20. The method according to claim 19, further comprising:
enabling the self-test bias voltage from the at least one capacitive element during the front end reset period of the self-test;
blocking the self-test bias voltage from the at least one capacitive element during the front end readout period;
measuring deflection of the at least one capacitive element during the front end readout period of the self-test;
comparing the measured deflection to a predefined return target value; and
determining the state of the at least one capacitive element based on the comparison.

* * * * *